(12) United States Patent
Cho et al.

(10) Patent No.: US 7,560,805 B2
(45) Date of Patent: Jul. 14, 2009

(54) SEMICONDUCTOR PACKAGE AND METHOD OF MANUFACTURING THE SAME

(75) Inventors: Young-sang Cho, Suwon-si (KR); Na-rae Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/812,307

(22) Filed: Jun. 18, 2007

(65) Prior Publication Data

US 2008/0006941 A1 Jan. 10, 2008

(30) Foreign Application Priority Data

Jul. 6, 2006 (KR) .................. 10-2006-0063506

(51) Int. Cl.
*H01L 23/02* (2006.01)
(52) U.S. Cl. .................. 257/678; 257/735; 257/737
(58) Field of Classification Search .................. 257/678, 257/735, 737, 778
See application file for complete search history.

(56) References Cited

U.S. PATENT DOCUMENTS

| 5,474,957 | A | * | 12/1995 | Urushima | .................. | 29/827 |
| 5,664,405 | A | * | 9/1997 | Perego | .................. | 53/457 |
| 6,501,184 | B1 | * | 12/2002 | Shin et al. | .................. | 257/778 |

FOREIGN PATENT DOCUMENTS

| JP | 11-307624 | 11/1999 |
| JP | 2004-153208 | 5/2004 |
| JP | 2005-216941 | 8/2005 |

* cited by examiner

*Primary Examiner*—Roy K Potter
(74) *Attorney, Agent, or Firm*—Harness, Dickey & Pierce, P.L.C.

(57) ABSTRACT

A package may include a semiconductor chip mounted on a film substrate. A method of manufacturing the same may involve providing a semiconductor chip. The semiconductor chip may include recesses and bumps. A film substrate including a through hole may be provided. The semiconductor chip may be inserted into the through hole of the film substrate. Circuit wires may be formed on the film substrate to contact the bumps of the semiconductor chip.

8 Claims, 5 Drawing Sheets

SEMICONDUCTOR PACKAGE AND METHOD OF MANUFACTURING THE SAME

PRIORITY STATEMENT

This application claims the benefit of Korean Patent Application No. 10-2006-0063506, filed on Jul. 6, 2006, in the Korean Intellectual Property Office, the disclosure of which is incorporated herein in its entirety by reference.

BACKGROUND

1. Field

Example embodiments relate to a semiconductor package and a method of manufacturing the same.

2. Description of the Related Art

Semiconductor devices may be thin, miniaturized, highly integrated, and/or include increased numbers of pins. A tape circuit substrate may used in the industrial field of semiconductor chip mounting technology. The tape circuit substrate may include patterned wiring layers connected to leads, both attached to a film that may be formed of an insulation material such as polyimide resin, for example. The tape circuit substrate may be manufactured using TAB technology to bond the leads of the tape circuit substrate to bumps that may be provided on a semiconductor chip. The tape circuit substrate may be referred to as a "TAB tape."

The leads and bumps may have small line widths, and thus may be difficult to align with each other. When a semiconductor chip is fixed to a TAB tape, the packaging may be carried out at a temperature of 300° C. to 400° C., for example. This thermal process may cause the tape film to expand, resulting in defective alignment.

If the alignment is defective, the leads of the tape and the bumps of the semiconductor chip may not be electrically connected with each other. Thus, the electrical characteristics of the semiconductor package may be degraded and/or the package may have defects.

SUMMARY

Example embodiments may provide a package that may reduce misalignment between a bump and a wire of a circuit when a semiconductor chip is mounted on a film substrate, and a method of manufacturing the same.

According to an example, non-limiting embodiments, a package may include a film substrate that may have a through hole. A semiconductor chip may be inserted into the through hole of the film substrate. The semiconductor chip may include bumps. Circuit wires may be provided on the film substrate and the semiconductor chip to contact the bumps.

According to another example, non-limiting embodiment, a method of manufacturing a package may involve providing a semiconductor chip having recesses and bumps. A film substrate including a through hole may be provided. The semiconductor chip may be inserted into the through hole of the film substrate. Circuit wires may be formed on the film substrate and the bumps of the semiconductor chip.

BRIEF DESCRIPTION OF THE DRAWINGS

Example, non-limiting embodiments will be described with reference to the attached drawings.

DETAILED DESCRIPTION OF EXAMPLE, NON-LIMITING EMBODIMENTS

Example, non-limiting embodiments will be described with reference to the accompanying drawings. The invention may, however, be embodied in many different forms, and should not be construed as being limited to the example embodiments set forth herein. Rather, the disclosed embodiments are provided so that this disclosure will be thorough and complete, and will fully convey the concept of the invention to those skilled in the art.

Well-known structures and processes are not described or illustrated in detail to avoid obscuring the present invention.

An element is considered as being mounted (or provided) "on" another element when mounted (or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

According to example embodiments, a semiconductor chip may be mounted on a film substrate, and wires of a circuit may be subsequently formed. Thus, the alignment between bumps of the semiconductor chip and the wires of the circuit may be improved. The improved alignment may reduce defective contacts, for example. Also, according to example embodiments, a surface of the semiconductor chip and a surface of the film substrate may be aligned to the same level. As a result, the height of the semiconductor package may be reduced, for example.

FIGS. 1 through 7 are cross-sectional views of an example method that may be implemented to prepare individual chips.

Figure 1:
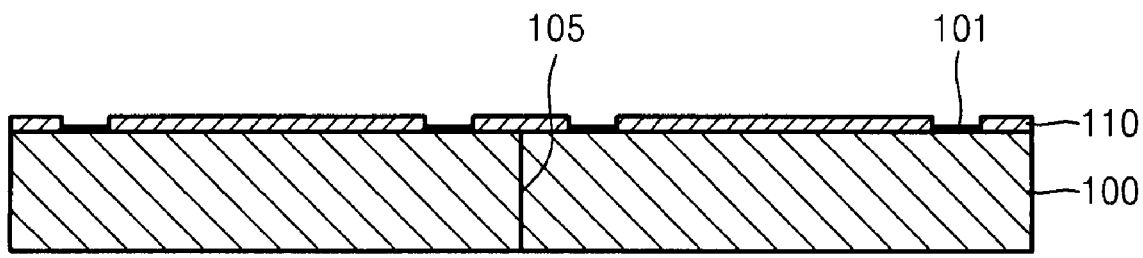
FIGS. 1 through 7 are cross-sectional views of a method that may be implemented to prepare individual chips according to an example embodiment.

Referring to FIG. 1, an insulation layer 110 may be formed on a substrate 100. By way of example only, the insulation layer 110 may be a polyimide-based layer. The substrate 100 may be a structure including semiconductor circuits. A pad electrode 101 may be formed on the substrate 100. The substrate 100 may be divided into multiple chips. Reference numeral 105 may represent a boundary line between the chips. Portions of the insulation layer 110 may be patterned to expose the pad electrode 101.

Figure 2:
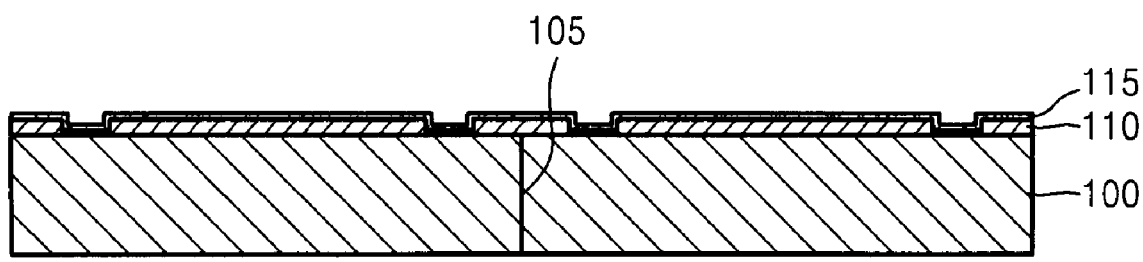

Referring to FIG. 2, a conductive seed layer 115 may be formed on the exposed pad electrode 101 and the insulation layer 110. The conductive seed layer 115 may be used in forming bumps. By way of example only, the conductive seed layer 115 may be formed of substantially the same material as the bumps. For instance, the conductive seed layer 115 may be formed of Au. The conductive seed layer 115 may be formed by sputtering, for example.

Figure 3:
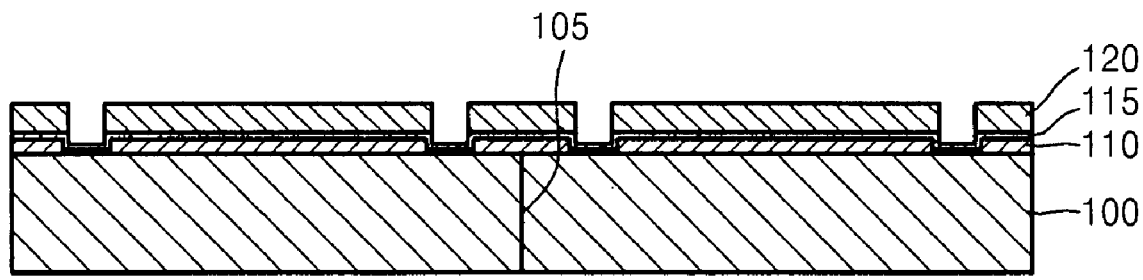

Referring to FIG. 3, a resist layer, e.g., a photoresist layer, may be coated over the conductive seed layer 115, and photoexposed and developed to form a resist pattern 120. The resist pattern 120 may expose portions of the conductive seed layer 115 formed on the pad electrode 101. A mask or reticle to form the resist pattern 120 may include an etch mask that may be used to pattern the insulation layer 110 for exposing the pad electrode 101. The resist pattern 120 may selectively expose the conductive seed layer 115 formed on the pad electrode 101.

Figure 4:
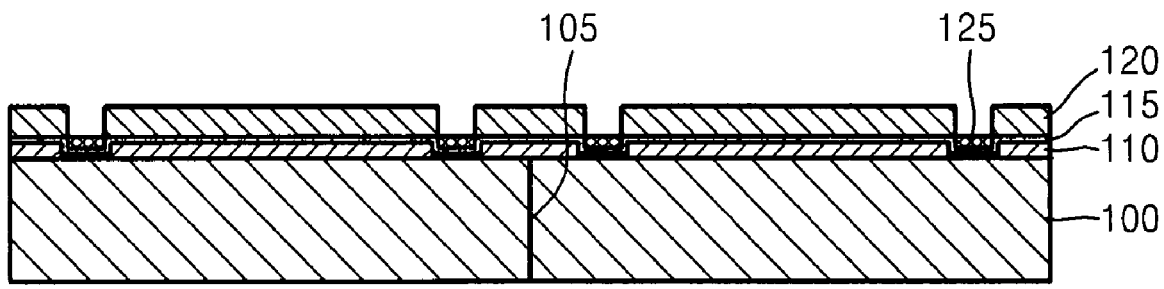

Referring to FIG. 4, the exposed portions of the conductive seed layer 115 may be plated (for example) to form bumps 125. By way of example only, the bumps 125 may be formed of Au.

Figure 5:
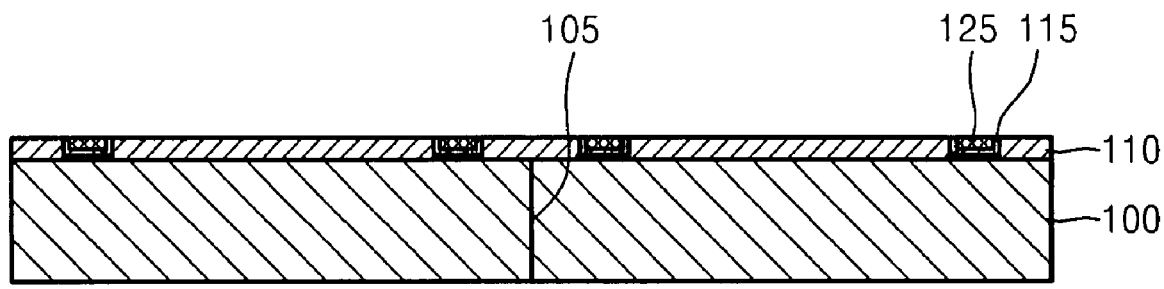

Referring to FIG. 5, the resist pattern 120 may be removed via techniques that are well known in this art. The bumps 125 and the insulation layer 110 may be planarized such that the bumps 125 and the insulation layer 110 may have substantially the same height. By way of example only, the planarization may involve an etch-back process and/or a chemical mechanical polishing (CMP) process.

Figure 6:
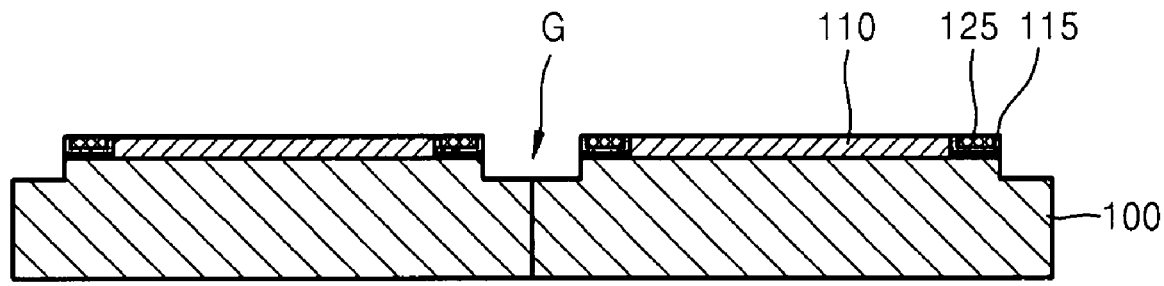

Referring to FIG. 6, openings G may be formed in portions of the insulation layer 110 and the substrate 100 including (and adjacent to) the chip boundary lines 105. The openings G may be formed by sawing, for example. The depth of the openings G may be equal to or less than the thickness of a film substrate (not shown) on which the semiconductor chips may be mounted. As described above, the portions where the openings G are formed may include the chip boundary lines 105, e.g., scribe lanes. These portions may not include wiring patterns and/or wiring patterns that may not be directly related to the operation of the semiconductor device. Thus, the openings G may not affect the device operation.

Figure 7:
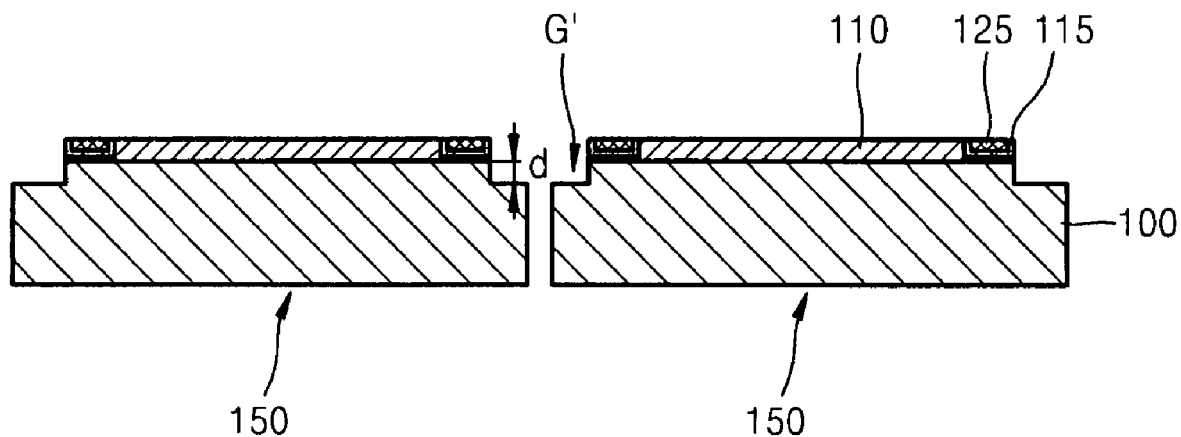

Referring to FIG. 7, the substrate 100 may be separated along the boundary lines 105 into a plurality of unit chips 150. The substrate 100 may be separated by sawing, for example. The bumps 125 of each unit chip 150 may have a predetermined height, and the insulation layer 110 may have substantially the same height as the bumps 125 and may be located on the substrate 100 between the bumps 125. A recess G' may be formed on edge portions of each of the unit chips 150 (i.e., the semiconductor chips). The recess G' may have a depth d that may be equal to or less than the thickness of the film substrate (not shown) on which the semiconductor chips 150 may be mounted. The recess G' may serve a retaining and/or locating function (for example) when the semiconductor chip 150 is mounted on the film substrate (not shown).

Figure 8:
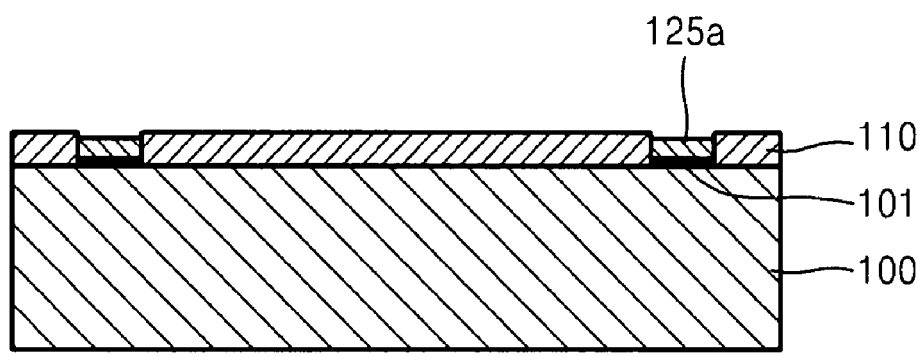
FIG. 8 is a cross-sectional view of a method that may be implemented to form bumps of a semiconductor chip according to another example embodiment.

As described above, the conductive seed layer 115 may be formed on the substrate 100 and the insulation layer 110. Portions of the conductive seed layer 115 contacting the pad electrode 101 may be exposed using the resist pattern 120. The bumps 125 may be formed on the exposed portions of the conductive seed layer 115. In alternative embodiments, the conductive seed layer 115 may be dispensed with. For example, as illustrated in FIG. 8, the insulation layer 110 may be patterned to expose the pad electrodes 101, and bumps 125a may be formed directly on the exposed pad electrodes 101 by plating, for example.

FIGS. 9 through 13 are cross-sectional views of a method that may be implemented to fabricate a package according to an example, non-limiting embodiment.

Figure 9:
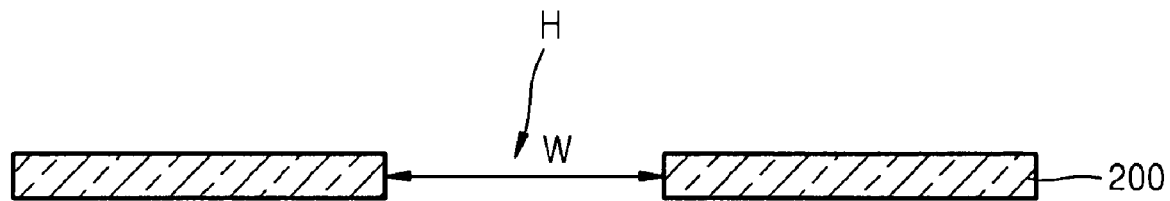
FIGS. 9 through 14 are cross-sectional views of a method that may be implemented to form a package according to an example embodiment.

Referring to FIG. 9, a bare film substrate 200 may be provided. The term "bare" may imply that the substrate 200 does not support any conductive patterns. By way of example only, the bare film substrate 200 may be formed of polyimide. A through hole H may be formed in the bare film substrate 200. By way of example only, the through hole H may be formed by punching the bare film substrate 200. The through hole H may have a width W that may be about equal to the distance between the opposed recesses G' of the unit semiconductor chip 150.

Figure 10:
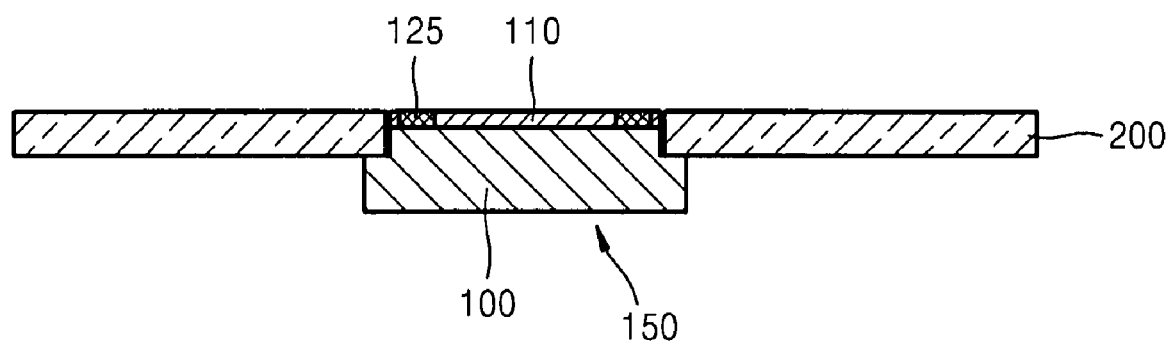

Referring to FIG. 10, the unit semiconductor chip 150 may be inserted into the through hole H of the bare film substrate 200. As shown, the recesses G' of the unit semiconductor chip 150 may engage with side walls of the bare film substrate defining the through hole H. The depth d of the recess G' may be determined such that the surface of the bare film substrate 200 may be flush with the surface of the bumps 125. Accordingly, the surface of the resultant unit semiconductor chip 150 (i.e., the surfaces of the insulation layer 110 and the bumps 125) may be flush with the bare film substrate 200.

Figure 11:
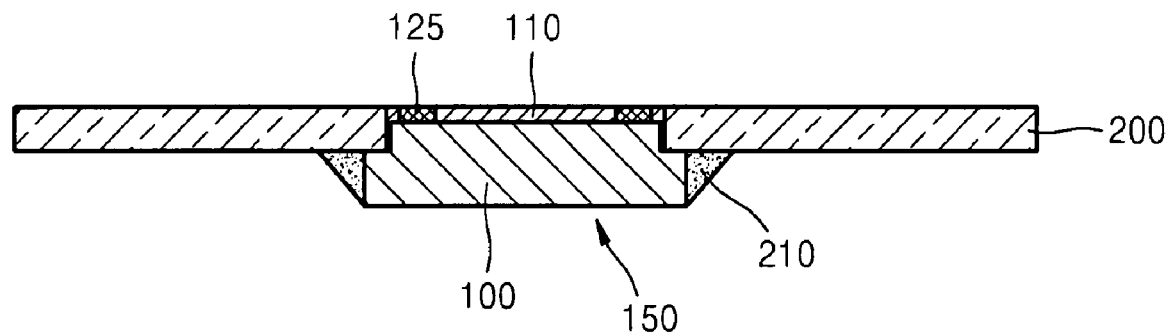

Referring to FIG. 11, an adhesion layer 210 may be formed on edges of the unit semiconductor chip 150 to fix the unit semiconductor chip 150 to the bare film substrate 200. The adhesion layers 210 may fill the corners where the unit semiconductor chip 150 and the bare film substrate 200 meet. For instance, the adhesion layers 210 may be formed in a triangular shape of a material such as resin, for example.

Figure 12:
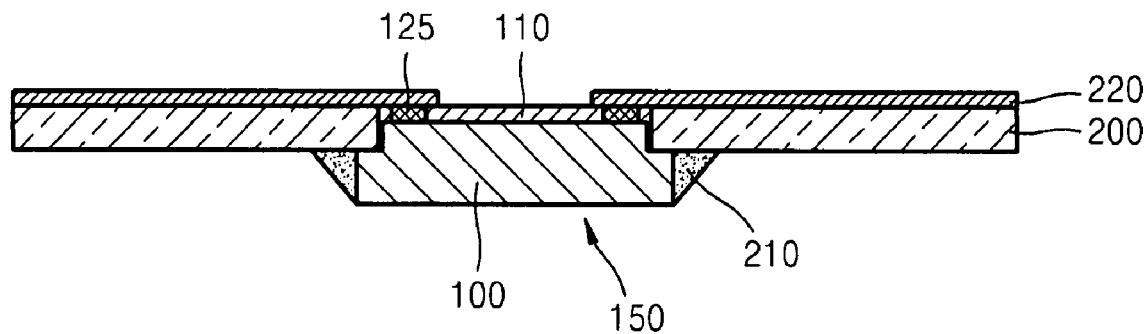

Referring to FIG. 12, circuit wires 220 may be formed after the unit semiconductor chip 150 is mounted on the bare film substrate 200. By way of example only, the circuit wires 220 may be formed of Cu. Here, a conductive layer may be provided on the bare film substrate 200 and the unit semiconductor chip 150 where the bumps 125 are formed, and portions of the conductive layer may be removed leaving the circuit wires 220 in contact with the bumps 125.

According to conventional wisdom, the unit semiconductor chip may be affixed to the film substrate that already includes circuit wires. Thus, it may be difficult to align and connect the bumps of the chip and the circuit wires of the film substrate. Even if the circuit wires and the bumps are aligned, the film substrate may expand when heat is provided to achieve adhesion between the bumps of the chip and the circuit wires of the film substrate. Thus, the positions of the circuit wires (relative to the bumps) may be distorted, resulting in defective contacts. However, according to example embodiments, the circuit wires 220 may be formed after the unit semiconductor chip 150 and the bare film substrate 200 are adhered together so that the bumps 125 and the circuit wires 200 may be aligned easily. Also, the bare film substrate 200 may not expand, and this may reduce the occurrence of defective contacts.

Figure 13:
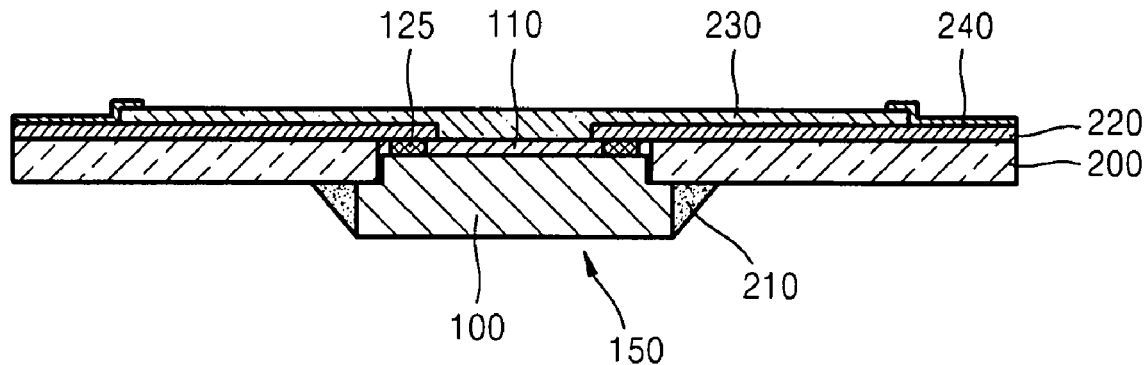

Referring to FIG. 13, a solder resist pattern 230 may be formed on the circuit wires 220. The solder resist pattern 230 may covers the circuit wires 220 to reduce oxidization of the Cu-based circuit wires 220, for example. Edge portions of the circuit wires 220 may be exposed, and plated layers 240 may be formed on the edge portions of the circuit wires 220. By way of example only, the plated layers 240 may include Sn, and may provide regions that contact pads of an external device, such as a liquid crystal display (LCD), for example.

Figure 14:
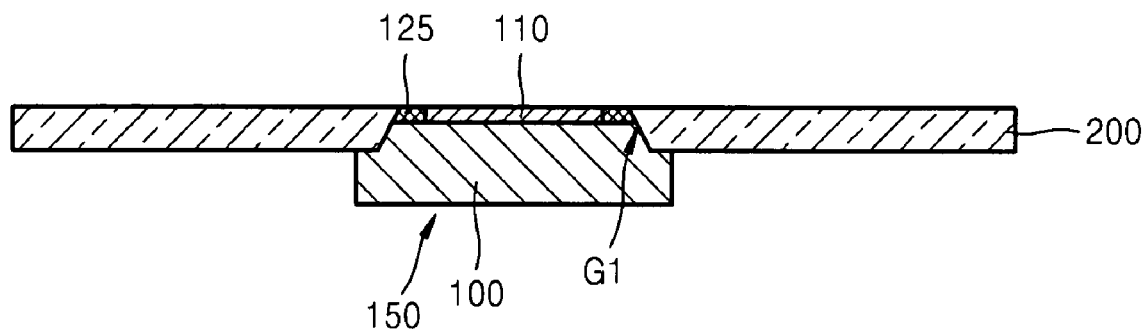

In the example embodiment, each of the recesses G' formed at the edges of the unit semiconductor chip 150 may have a surface perpendicular to a major surface of the unit semiconductor chip 150. The through hole H of the bare film substrate 200 may also have a surface perpendicular to a major surface of the bare film substrate 200. In alternative embodiments, however, the recesses G' and the through hole H may have numerous and varied structures. For example, as illustrated in FIG. 14, the sidewalls of the recesses G1 in the unit semiconductor chip 150 may have an inclined profile, and the sidewalls of the through hole formed in the bare film substrate 200 may have a corresponding inclined profile.

In the example embodiments, the film substrate may be used as a mounting member. In alternative embodiments, numerous and varied other mounting members may be suitably implemented, including an insulation member and a circuit pattern.

According to example embodiments, the circuit wires may be formed after the semiconductor chips are mounted on a bare film substrate. This may facilitate forming a connection between the circuit wires and the bumps of the semiconductor chips. When the circuit wires are formed, the bare film substrate may not expand, thereby reducing defective contacts.

Example, non-limiting embodiments have been particularly shown and described. It will be understood by those of ordinary skill in the art that various changes in form and detail may be implemented without departing from the spirit and scope of the present invention as defined by the following claims.

What is claimed is:

1. A package comprising:
a film substrate including a through hole;
a semiconductor chip inserted into the through hole of the film substrate and including bumps; and
circuit wire patterns provided on the film substrate,
wherein the circuit wire patterns extend to the bumps on the semiconductor chip, and the circuit wire patterns are provided so as to be aligned to the bumps.

2. The package of claim 1, further comprising an insulation layer located between the bumps.

3. The package of claim 2, wherein the bumps and the insulation layer are flush with a surface of the film substrate.

4. A package comprising:
a film substrate including a through hole;
a semiconductor chip inserted into the through hole of the film substrate and including bumps; and
circuit wires provided on the film substrate and the semiconductor chip to contact the bumps,
wherein edges of the semiconductor chip include recesses the engage with side walls of the through hole in the film substrate.

5. The package of claim 4, wherein the through hole has a width substantially equal to a distance between the recesses of the semiconductor chip.

6. The package of claim 4, wherein a distance from a top of the bumps to a bottom of the recess is substantially equal to a thickness of the film substrate.

7. A package comprising:
a film substrate including a through hole;
a semiconductor chip inserted into the through hole of the film substrate and including bumps;
circuit wires provided on the film substrate and the semiconductor chip to contact the bumps; and
an adhesion member provided at corner portions where the semiconductor chip and the film substrate meet each other.

8. The package of claim 1, further comprising:
a solder resist provided on the circuit wire patterns and exposing edge portions of the circuit wire patterns; and
plated layers formed on the edge portions of the circuit wire patterns.

* * * * *